(12) United States Patent
Scheidemann et al.

(10) Patent No.: US 7,442,920 B2
(45) Date of Patent: Oct. 28, 2008

(54) OPTICAL BENCH FOR A MASS SPECTROMETER SYSTEM

(75) Inventors: Adi A. Scheidemann, Baden (CH);
Mark S. McGraw, Carnation, WA (US);
Clare R. Long, Edmonds, WA (US);
Gottfried P. Kibelka, Seattle, WA (US)

(73) Assignee: O. I. Corporation, College Station, TX (US)

( * ) Notice: Subject to any disclaimer, the term of this patent is extended or adjusted under 35 U.S.C. 154(b) by 290 days.

(21) Appl. No.: 11/205,758

(22) Filed: Aug. 16, 2005

(65) Prior Publication Data

US 2006/0076483 A1 Apr. 13, 2006

Related U.S. Application Data

(60) Provisional application No. 60/601,803, filed on Aug. 16, 2004, provisional application No. 60/601,810, filed on Aug. 16, 2004, provisional application No. 60/601,867, filed on Aug. 16, 2004.

(51) Int. Cl.
*B01D 59/44* (2006.01)
(52) U.S. Cl. .................... 250/281; 250/299; 250/300
(58) Field of Classification Search .......... 250/281–300
See application file for complete search history.

(56) References Cited

U.S. PATENT DOCUMENTS

| 4,859,848 | A | | 8/1989 | Bowman et al. |
| 5,046,018 | A | * | 9/1991 | Flewelling et al. ............ 702/24 |
| 5,231,591 | A | * | 7/1993 | Flewelling et al. ............ 702/24 |
| 5,386,115 | A | | 1/1995 | Freidhoff et al. |
| 6,051,832 | A | | 4/2000 | Bradshaw |
| 6,316,768 | B1 | * | 11/2001 | Rockwood et al. .......... 250/287 |
| 6,831,276 | B2 | * | 12/2004 | Berger et al. ................ 250/296 |
| 6,839,476 | B2 | * | 1/2005 | Kim et al. ..................... 385/14 |
| 6,879,423 | B2 | * | 4/2005 | Kim et al. .................... 359/245 |
| 6,978,058 | B2 | * | 12/2005 | Kim et al. ..................... 385/14 |
| 7,197,202 | B2 | * | 3/2007 | Kim et al. ..................... 385/14 |

(Continued)

OTHER PUBLICATIONS

Scheidemann, A., et al., "Faraday Cup Detector Array with Electronic Multiplexing for Multichannel Mass Spectrometry," J. Vac. Sci. Technol. A, 20(3):597-604, May/Jun. 2002.

*Primary Examiner*—Jack I. Berman
*Assistant Examiner*—Andrew Smyth
(74) *Attorney, Agent, or Firm*—Seed IP Law Group PLLC

(57) ABSTRACT

Mass spectrometer systems for measuring mass/charge ratios of analytes are described. A mass spectrometer system includes a vacuum flange, a PCB base plate coupled to the vacuum flange, and an ion optic assembly coupled to the PCB base plate. The PCB base plate may include signal-processing electronics. The system may include an electrical cable coupled to the PCB base plate for supplying power, control, and I/O to the ion optic assembly and the signal processing electronics. Alternatively, a mass spectrometer system includes a PCB base plate and an ion optic assembly. The PCB base plate has a sealant portion and an electrical portion. The ion optic assembly is coupled to the electrical portion. The system may include a vacuum housing for enclosing the ion optic assembly. The vacuum housing is coupled to the sealant portion of the PCB base plate for sustaining a vacuum while the system is in operation.

26 Claims, 6 Drawing Sheets

U.S. PATENT DOCUMENTS

| | | | |
|---|---|---|---|
| 2004/0109627 A1* | 6/2004 | Kim et al. | 385/14 |
| 2004/0109628 A1* | 6/2004 | Kim et al. | 385/14 |
| 2004/0120631 A1* | 6/2004 | Kim et al. | 385/14 |
| 2004/0136099 A1* | 7/2004 | Kim et al. | 359/824 |
| 2004/0222374 A1* | 11/2004 | Scheidemann et al. | 250/299 |
| 2006/0076482 A1* | 4/2006 | Hobbs et al. | 250/287 |
| 2006/0097147 A1 | 5/2006 | Anderson et al. | |

* cited by examiner

OPTICAL BENCH FOR A MASS SPECTROMETER SYSTEM

CROSS-REFERENCE TO RELATED APPLICATION

This application claims the benefit of U.S. Provisional Patent Application Nos. 60/601,803 filed on Aug. 16, 2004, 60/601,810 filed on Aug. 16, 2004, and 60/601,867 filed on Aug. 16, 2004.

BACKGROUND OF THE INVENTION

1. Field of the Invention

This disclosure pertains to assemblies of ion optics and more particularly to assemblies of ion optic elements on an optical bench for mass spectrometer systems. 2. Description of the Related Art Mass spectrometry is widely used in many applications ranging from process monitoring to life sciences. Over the course of the last 60 years, a wide variety of instruments have been developed. The focus of new developments has been two fold: (1) a push for ever higher mass range with high mass resolution, and (2) on developing small, desktop mass spectrometry instruments.

Mass spectrometers are often coupled with gas chromatographs for analysis of complex mixtures. This is particularly useful for analysis of volatile organic compounds (VOCs) and semi-volatile organic compounds (semi-VOCs). A combined gas chromatograph and mass spectrometer or spectrograph (GC/MS) instrument typically includes a gas inlet system, which may include the gas chromatograph portion of the GC/MS instrument. The GC/MS instrument typically also includes an electron impact (EI) based ionizer with ion extractor, ion optic components to focus the ion beam, ion separation components, and ion detection components. Ionization can also be carried out via chemical ionization.

Ion separation can be performed in the time or spatial domain. An example for mass separation in the time domain is a time of flight mass spectrometer. Spatial separation is seen in commonly used quadrupole mass spectrometers. Here the "quadrupole filter" allows only one mass/charge ratio to be transmitted from the ionizer to the detector. A full mass spectrum is recorded by scanning the mass range through the "mass filter." Other spatial separation is based on magnetic fields where either the ion energy or the magnetic field strength is varied, and where the mass filter allows only one mass/charge ratio to be transmitted and a spectrum can be recorded by scanning through the mass range.

One type of mass spectrometer is a mass spectrograph. In a mass spectrograph the ions are spatially separated in a magnetic field and detected with a position sensitive detector. The concept of a double focusing mass spectrograph was first introduced by Maftauch and Herzog (MH) in 1940 (*J. Mattauch, Ergebnisse der exakten Naturwissenschaften*, vol. 19, pp. 170-236, 1940).

Double focusing refers to an instrument's ability to refocus both the energy spread as well as the spatial beam spread. Modern developments in magnet and micro machining technologies allow dramatic reductions in the size of these instruments. The length of the focal plane in a mass spectrometer capable of VOC and semi-VOC analysis is reduced to a few centimeters.

The typical specifications of a small confocal plane layout Maftauch-Herzog instrument are summarized below:
Electron impact ionization, Rhenium filament
DC-voltages and permanent magnet
Ion Energy: 0.5-2.5 kV DC
Mass Range: 2-200 D
Faraday cup detector array or strip charge detector
Integrating operational amplifier with up to $10^{11}$ gain
Duty Cycle: >99%
Read-Out time: 0.03 sec to 10 sec
Sensitivity: approximately 10 ppm with strip charge detector In addition, the ion optic elements are mounted in the vacuum chamber floor or on chamber walls. The optics can also be an integral part of the vacuum housing. In small instruments, however, the ion optic elements can be built on a base plate that acts as an "optical bench." This bench supports the ion optic elements. The base plate is mounted against a vacuum or master flange to provide a vacuum seal needed to operate the mass spectrometer under vacuum. The base plate can also function as the vacuum or master flange itself.

A Mattauch-Herzog ion detector is a position sensitive detector. Numerous concepts have been developed over the last decades. Recent developments focus on solid state based direct ion detection as an alternative to previously used electro optical ion detection (EOID).

The electro optical ion detector (EOID) converts the ions in a multi-channel-plate (MCP) into electrons, amplifies the electrons (in the same MCP), and illuminates a phosphorus film bombarded with the electrons emitted from the MCP. The image formed on phosphorus film is recorded with a photo diode array via a fiber optic coupler. This type of EOID is described in detail in U.S. Pat. No. 5,801,380. The EOID is intended for the simultaneous measurement of ions spatially separated along the focal plane of the mass spectrometer. The EOID operates by converting ions to electrons and then to photons. The photons form images of the ion-induced signals. The ions generate electrons by impinging on a microchannel electron multiplier array. The electrons are accelerated to a phosphor-coated fiber-optic plate that generates photon images. These images are detected using a photodetector array.

According to a different configuration, a direct charge measurement can be based on a micro-machined Faraday cup detector array. Here, an array of individually addressable Faraday cups monitors the ion beam. The charge collected in individual elements of the array is handed over to an amplifier via a multiplexer unit. This layout reduces the number of amplifiers and feedthroughs needed. This concept is described in detail in recent publications, such as "A. A. Scheidemann, R. B. Darling, F. J. Schumacher, and A. Isakarov, *Tech. Digest of the 14th Int Forum on Process Analytical Chem.* (IFPAC-2000), Lake Las Vegas, Nev., Jan. 23-26, 2000, abstract 1-067"; "R. B. Darling, A. A. Scheidemann, K. N. Bhat, and T.-C. Chen., *Proc. of the 14th IEEE Int. Conf on Micro Electro Mechanical Systems* (MEMS-2001), Interlaken, Switzerland, Jan. 21-25, 2001, pp. 90-93"; and Non-Provisional patent application Ser. No. 09/744,360 titled "Charged Particle Beam Detection System."

Other important references regarding spectrometers are Nier, D. J. Schlutter, *Rev. Sci. Instrum.* 56(2), pp. 214-219, 1985; "Fundamentals of Focal Plane Detector cs" K. Birkinshaw Jrnl. of Mass Spectrometry, Vol. 32,795-806 (1997); and T. W. Burgoyne et. al., *J. Am. Soc. Mass Spectrum* 8, pp. 307-318, 1997.

Alternatively, especially for low energy ions, a flat metallic strip (referred to as a strip charge detector (SCD)) on a grounded and insulated background can be used with an MCP. As described above, an MCP converts ions into electrons and amplifies the electrons. The SCD detects the electrons and generates a charge. Again the charge is handed over to an amplifier via a multiplexer.

Another embodiment of an ion detector array is disclosed in U.S. Pat. No. 6,576,899 and is referred to as a shift register based direct ion detector.

The shift register based direct ion detector defines a charge sensing system that can be used in a GC/MS system, with a modification to allow direct measurement of ions in the mass spectrometer device without conversion to electrons and photons (e.g., EOID prior to measurement). The detector may use charge coupled device (CCD) technology with metal oxide semiconductors. The GC/MS system may use direct detection and collection of the charged particles using the detector. The detected charged particles form the equivalent of an image charge that directly accumulates in a shift register associated with a part of the CCD. This signal charge can be clocked through the CCD in a conventional way, to a single output amplifier. Since the CCD uses only one charge-to-voltage conversion amplifier for the entire detector, signal gains and offset variations of individual elements in the detector array are minimized.

A Mattauch-Herzog detector array, which can be composed of a Faraday cup detector array, a strip charge detector, or another type of the aforementioned detectors, is placed at the exit end of the magnet, which is commonly designed to be coplanar with the focal plane of the device.

The resolution of the Mattauch-Herzog instrument is governed, among other quantities, by a width of an object slit and the spatial resolution of the detector. Thus one desires to make the object slit as narrow as possible. However, the total ion current leaving the ionizer corresponds to an area (i.e., size) of the object slit. Thus too small of an object slit may lead to ion currents which are too small for practical applications. Typically, object slit sizes from 0.1 to 0.01 mm are desirable. A detailed discussion of the Mattauch-Herzog equation is given in "Nier, D. J. Schlutter, $Rev. Sci. Instrum.$ 56(2), pp. 214-219, 1985; and T. W. Burgoyne et. al., $J. Am. Soc. Mass Spectrum$ 8, pp. 307-318, 1997.

FIG. 1 shows a GC/MS instrument 100. The instrument 100 includes a Mattauch-Herzog double focusing MS 110 assembled with a GC 150. The MS 110 includes an ionizer 114, a shunt and aperture 116, an electrostatic energy analyzer 118, a magnetic section 120, and a focal plane section 122 (also referred to as a detector).

In operation of the MS 110, a gaseous material or a vapor is introduced into the ionizer 114, either directly or through the GC 150 (for complex mixtures or compounds). The material is bombarded by electrons to produce ions. The ions are focused in the shunt and aperture section 116 to form an ion beam 124. The ions are separated according to their charge/mass ratio as they move through the electrostatic energy analyzer 118 and the magnetic section 120. The ions are then detected in the focal plane section 122, as described in U.S. Pat. No. 5,801,380. The ion separation process takes place under a vacuum pressure on the order of about $10^{-5}$ Torr, which can be achieved with a vacuum pump (not shown).

The GC 150 includes a sample injector valve V, which has an entry port S for introduction of the sample, and an exit port W for the waste after the sample has been vaporized and/or decomposed, typically by heat. The sample injector valve V may be a liquid injector. The part to be analyzed, referred to as analyte is carried by a carrier gas, such as dry air, hydrogen, or helium, for example, to a capillary microbore column M (wall coated open tubular, or porous layer open tubular, or packed, etc.), where its constituents are separated by different absorption rates on the wall of the microbore column M. The microbore column M has a rather small inside diameter, of the order of about 50-500 µm in the illustrated embodiment. The carrier gas flow rate is about 0.2 to 5 atm. $cm^3$/sec, although higher flow rates, for example 20 atm. $cm^3$/sec, are possible.

A larger microbore column M bore requires a larger vacuum pump, whereas a smaller bore produces narrower peaks of the effluent, which may result in a loss of signal. In general, the gas flow rate is a function of the inner diameter, the length of the column M, the pressure of the carrier gas, and the temperature of the carrier gas. The width of the peak again is a function of the injection time, the stationary phase of the column (e.g., polarity, film thickness, distribution in the column), the width and length of the column, the temperature and the gas velocity. One method of determining a size of the microbore column M bore is addressed in U.S. Pat. No. 6,046,451.

Patents representing major advances in the art of mass spectrometers and gas chromatographs/mass spectrometers are U.S. Pat. Nos. 5,317,151; 5,801,380; 6,046,451; 6,182,831; 6,191,419; 6,403,956; 6,576,899; and 6,847,036. Also U.S. patent application Ser. Nos. 10/811,576 and 10/860,776.

BRIEF SUMMARY OF THE INVENTION

In one embodiment, a mass spectrometer system includes a vacuum flange, a PCB base plate coupled to the vacuum flange, and an ion optic assembly coupled to the PCB base plate. The system may further include a vacuum housing for enclosing the PCB base plate and the ion optic assembly. The vacuum housing is coupled to a sealant portion of the vacuum flange for sustaining a vacuum while the system is in operation. The system may further include an electrical cable coupled to the PCB base plate for supplying power to the ion optic assembly.

In addition, the PCB base plate may include signal-processing electronics for processing signals received from the ion optic assembly. In one embodiment, the ion optic assembly includes an ionizer, an electrostatic energy analyzer, a magnetic section, and a detector.

In yet another embodiment, the PCB base plate is formed of multiple layers. In a further embodiment, the PCB base plate includes a substrate formed of FR-4 material.

In another embodiment, a mass spectrometer system includes a PCB base plate and an ion optic assembly. The PCB base plate has a sealant portion and an electrical portion. The ion optic assembly is coupled to the electrical portion of the PCB base plate. The electrical portion of the PCB base plate may include signal-processing electronics for processing signals received from the ion optic assembly.

The system may further include a vacuum housing for enclosing the electrical portion and the ion optic assembly. The vacuum housing is coupled to the sealant portion of the PCB base plate for sustaining a vacuum while the system is in operation. In another embodiment, the ion optic assembly includes an ionizer, an electrostatic energy analyzer, a magnetic section, a detector, and a shunt and aperture.

In a further embodiment, a printed circuit board includes a first portion having a first set of mounting holes to mount a first ion optic element, and a second portion having a second set of mounting holes to mount a second ion optic element. Furthermore, the first set of mounting holes are placed with respect to the second set of mounting holes to form a first portion of an ion beam path.

BRIEF DESCRIPTION OF THE SEVERAL VIEWS OF THE DRAWINGS

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn, are not intended to convey any information regarding the actual shape of the particular elements, and have been solely selected for ease of recognition in the drawings.

DETAILED DESCRIPTION OF THE INVENTION

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with mass spectrometer instruments have not been shown or described in detail to avoid unnecessarily obscuring descriptions of the embodiments.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment" or "an embodiment" means that a particular feature, structure or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

The headings provided herein are for convenience only and do not interpret the scope or meaning of the embodiments.

Figure 1:
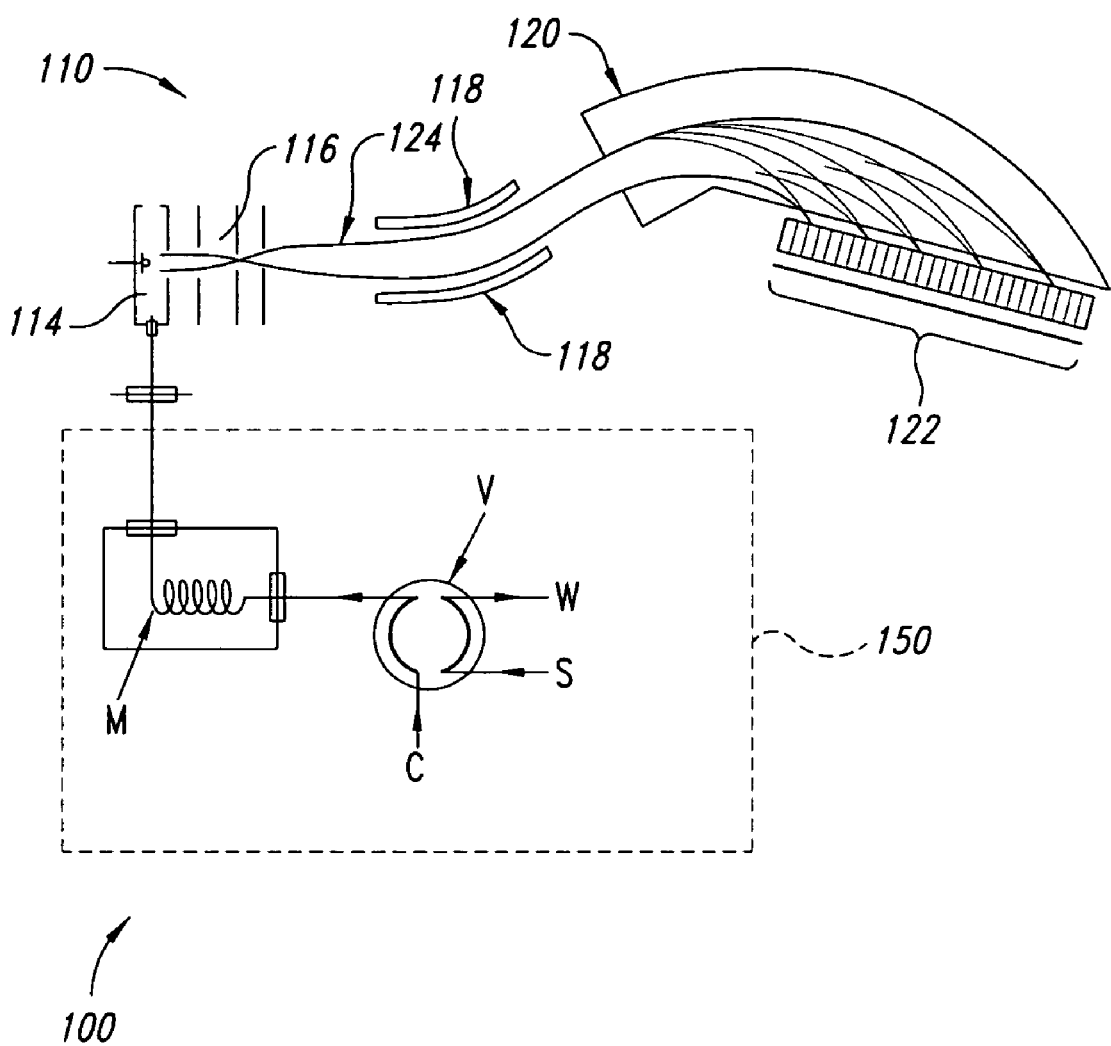
FIG. 1 is a schematic diagram of a combined gas chromatograph/Mattauch-Herzog spectrometer, according to known art.
Figure 2:
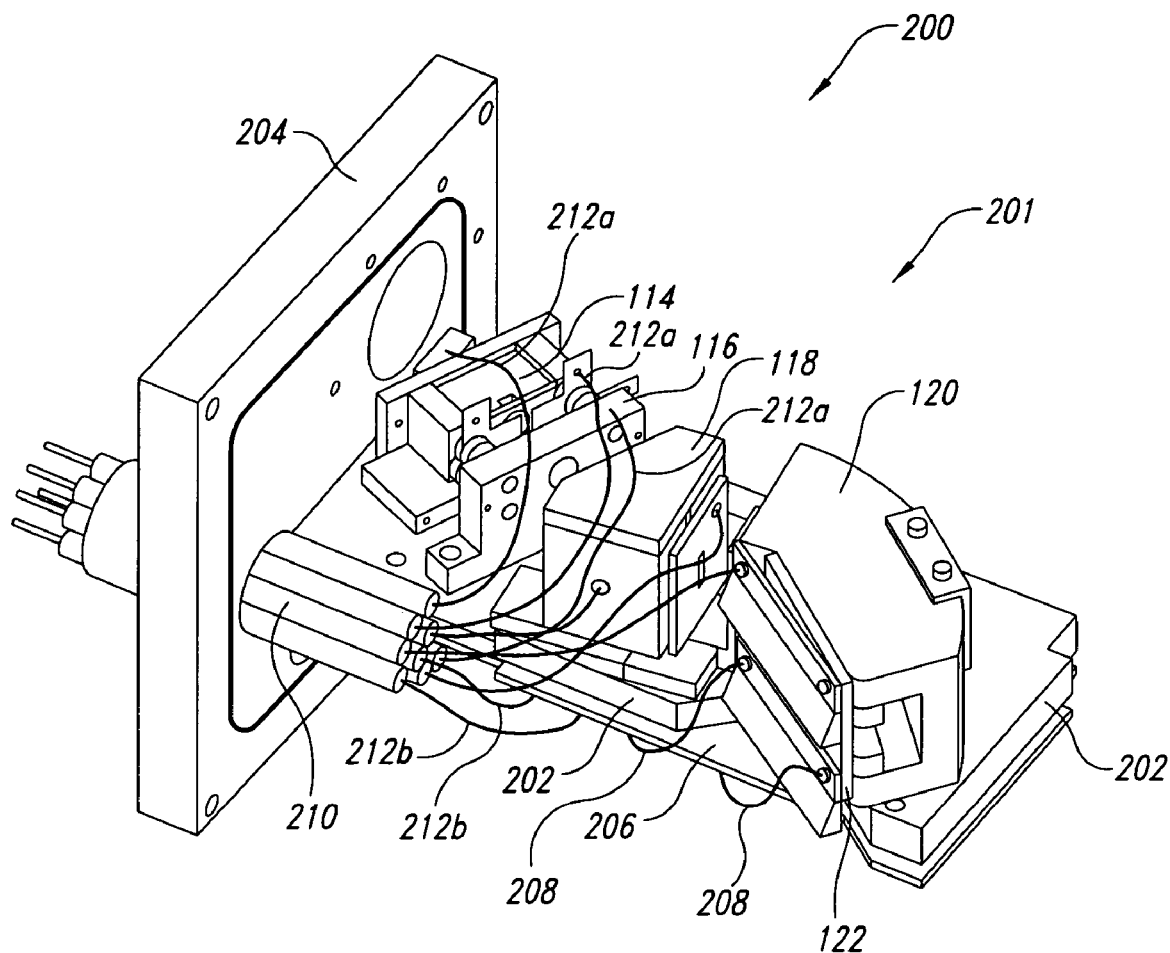
FIG. 2 is an isometric view of a mass spectrometer system.

FIG. 2 is an isometric view of a mass spectrometer system 200. The mass spectrometer system 200 includes an ion optic assembly 201. The ion optic assembly 201 includes the ionizer 114, the shunt and aperture 116, the electrostatic energy analyzer 118, the magnetic section 120 and the detector 122, (individually referred to as ion optic elements). The ion optic elements 114-122 are coupled to an optical bench 202 (also referred to as a base plate). Additionally, the system 200 includes a vacuum flange 204 and a printed circuit board (PCB) 206. The base plate 202 is mounted to the vacuum flange 204.

The PCB 206 may include signal-processing electronics such as multiplexers and amplifiers (not shown) for processing signals received from the detector 122. The system 200 includes detector leads 208 for electrically connecting the signal processing electronics of the PCB 206 to the detector 122. The system 200 may include additional conducting leads (not shown) for electrically connecting the PCB 206 to the ion optic elements 114-122.

An electrical cable 210 includes conducting leads 212a and 212b. The conducting leads 212a allow power to be delivered to the ion optic elements 114-122, and the conducting leads 212b allow power and I/O to be delivered to and from the signal processing electronics of the PCB 206. As illustrated, the electrical cable 210 accesses the ion optic assembly 201 and the PCB 206 via the vacuum flange 204. The assemblage of the base plate 202 with the ion optic assembly 201 is typically well organized, allowing a user easy access to the ion optic elements 114-122, particularly when the base plate 202 is removed from the vacuum flange 204.

However, a drawback of the system 200 is that the conducting leads 212a that provide power to the ion optic elements 114-122 and the detector leads 208 that allow control signals and I/O to be sent between the detector 122 and the signal processing electronics of the PCB 206 are cumbersome and not easily integrated into the design of the system 200. In addition, the conducting leads 212a and the detector leads 208 may generate electromagnetic noise and introduce inaccuracies when the system 200 is measuring ionic charge-to-mass ratios. The system 200 may not compensate for these inaccuracies, and may require frequent recalibration of the ion optic assembly 201.

Figure 3:
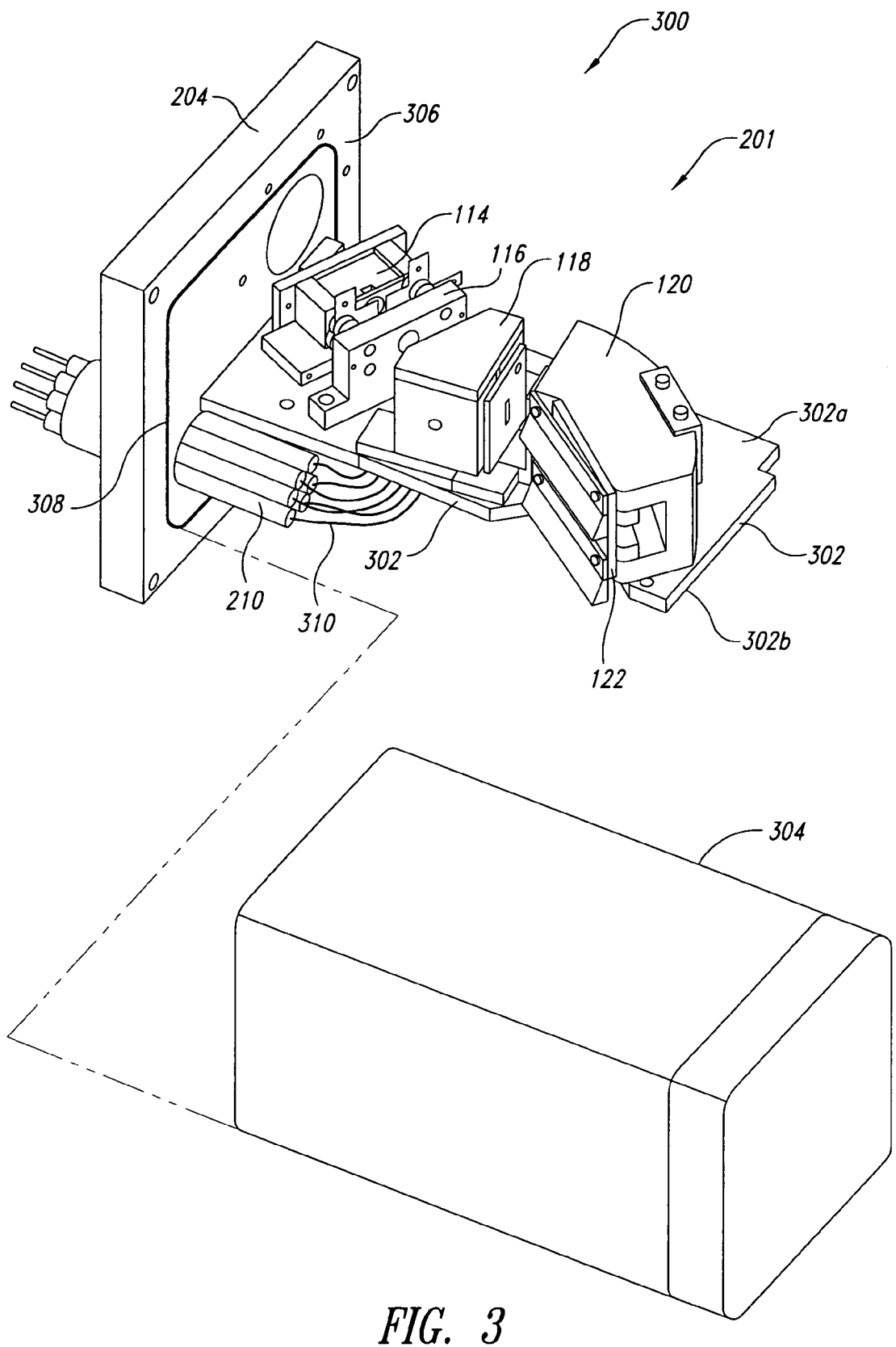
FIG. 3 is an isometric view of a mass spectrometer system, according to an embodiment of the invention.

FIG. 3 is an isometric view of a mass spectrometer system 300, according to an embodiment of the invention. The mass spectrometer system 300 includes the ion optic assembly 201. The ion optic assembly 201 includes the ionizer 114, the shunt and aperture 116, the electrostatic energy analyzer 118, the magnetic section 120, and the detector 122. Additionally, the system 300 includes the vacuum flange 204, a PCB base plate 302, and a vacuum housing 304. The PCB base plate 302 includes a front side 302a and a backside 302b. The ion optic elements 114-122 are connected to the front side 302a of the PCB base plate 302.

The vacuum flange 204 has a side 306 and a sealant portion 308. In one embodiment, the sealant portion 308 is an O-ring. However, in the spirit of the present invention, the sealant portion 308 may be any type of sealant device and/or material as appreciated by one of skill in the art. The PCB base plate 302 is mounted to the side 306 of the vacuum flange 204. The vacuum housing 304 mounts to the sealant portion 308 of the vacuum flange 204, thus enclosing the ion optic assembly 201 and the PCB base plate 302 and providing a vacuum seal with the vacuum flange 204. Typically, a pump (not shown) is coupled to the vacuum housing 304 or vacuum flange 204 to create a partial vacuum within the region enclosed by the vacuum housing 304 and the vacuum flange 204.

In the embodiment of the invention as illustrated, the PCB base plate 302 secures the ion optic elements 114-122 in a fixed and precise positional relationship with respect to one another. That is, the PCB base plate 302 provides a stable optical platform, allowing the ion optic elements 114-122 to be rigidly mounted with respect to one another. In addition, the PCB base plate 302 may be thinner and/or lighter than the base plate 202 (FIG. 2), thus allowing the system 300 to be more compact and portable than the system 200.

Furthermore, configuration of system 300 with the PCB base plate 302 allows for a minimum number of conducting leads for providing power, control, and/or I/O to the ion optic elements 114-122. In the embodiment as illustrated, the electrical cable 210 is electrically coupled to the PCB base plate 302 via the conducting leads 310. Furthermore, the ion optic elements 114-122 are electrically coupled to the PCB base plate 302 for receiving power, control and/or I/O signals from the conducting leads 310. As discussed further below in conjunction with FIG. 4, the ion optic elements 114-122 are coupled to the wire leads 310 via conducting traces, vias, and metallic pads of the PCB base plate 302. The PCB base plate 302 may also include signal processing electronics such as multiplexers, amplifiers, and digital signal processors, for example, that electrically couple to the detector 122 via the conducting traces, vias, and/or metallic pads of the PCB base plate 302 for processing the signals received from the detector 122. PCB base plate signal processing electronics will be discussed further below in conjunction with FIG. 4. The PCB base plate 302 provides any combination of power, I/O signal routing, and control signals to the ion optic elements 114-122 using a minimum number of conducting leads.

Figure 4:
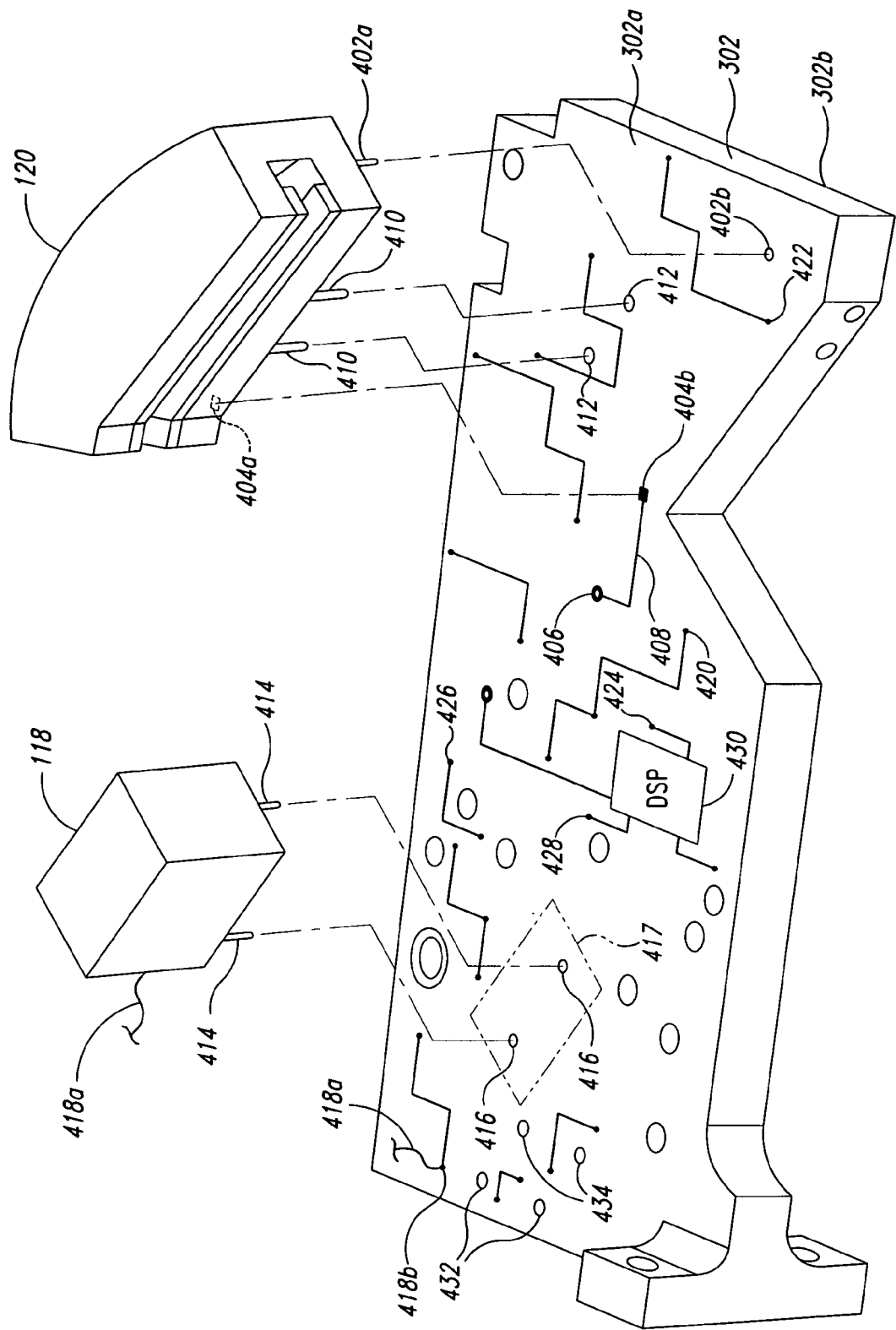
FIG. 4 is an isometric view of the front side of the PCB base plate of the mass spectrometer system of FIG. 3, according to an embodiment of the invention.

FIG. 4 is an isometric view of the front side 302a of the PCB base plate 302 of FIG. 3, according to an embodiment of the invention. The front side 302a of the PCB base plate 302 may include conductive traces, conductive and/or nonconductive vias, metallic pads, bumps and/or solder points, bolt holes for securing electrical components, and signal processing electronics including multiplexers, amplifiers and digital signal processors, for example, for processing signals received from the detector 122 (FIG. 3). The term "conductive trace" as used herein and in the claims includes any electrically conductive path carried by the PCB base plate 302, whether formed on, in or through the PCB base plate 302. Furthermore, the PCB base plate 302 may be a multi-layered PCB, including one or more inner layers. Each inner layer may have a plurality of inner conducting traces, electrical connectors, and/or additional electronic circuitry. A multi-layer board is advantageous since the conducting traces of one layer are electrically shielded from the conducting traces of other layers, thereby reducing and/or confining electromagnetic noise. In the spirit of the present invention, one skilled in the art will recognize that the PCB base plate 302 may have any combination of conducting traces, vias, passive and active electronic components, and electrical connectors (i.e., pads, bumps, etc.) for powering the ion optic elements 114-122 (FIG. 3), processing signals received from the detector 122, and providing I/O and/or control signals to any of the ion optic elements 114-122 or any signal processing electronics of the PCB base plate 302.

In the exemplary embodiment as illustrated, the magnetic section 120 (of the ion optic assembly 201) includes a pin 402a and a metallic connector 404a for coupling to the PCB base plate 302. The PCB base plate 302 includes a conductive via 402b (also referred to as a pin through-hole) for receiving and electrically coupling to the pin 402a. The conductive via 402b may electrically couple to one or more inner traces (not shown) or conductive traces on the backside 302b of the PCB base plate 302 (also referred to as backside traces). The backside traces will be discussed further below in conjunction with FIG. 5. In addition, the PCB base plate 302 includes a metallic pad 404b for electrically coupling to the metallic connector 404a of the magnetic section 120. In the exemplary embodiment as illustrated, the metallic pad 404b is coupled to a conductive via 406 by a conductive trace 408.

In addition, the magnetic section 120 may have fasteners 410 (e.g., bolts) for mounting the section 120 securely to the PCB base plate 302. For, example, the PCB base plate 302 may include non-conducting vias 412 (e.g., bolt holes) for receiving the fasteners 410 to connect the magnetic section 120 to the PCB base plate 302.

The PCB base plate 302 may also include insulating regions to which an element of the ion optic assembly 201 may be mounted via fasteners. For example, in the embodiment as illustrated, the electrostatic energy analyzer 118 includes fasteners 414 for coupling with non-conductive vias 416 of an insulating region 417 of the PCB base plate 302. In addition, the electrostatic energy analyzer 118 includes a conducting lead 418a for electrically connecting to a metallic bump 418b (i.e., one type of electrical connector of the PCB base plate 302). However, as one of skill in the art will appreciate, the conducting lead 418a may connect to any electrically conducting structure of the PCB base plate 302, such as a metallic pad, trace, or conducting via, for example. In the embodiment as illustrated, the PCB base plate 302 includes non-conducting vias (i.e., mounting holes) 432 and 434 for mounting the ionizer 114 and the shunt and aperture 116, respectively.

Similarly, other electrical conductors (e.g., 420, 422, 424, 426, and 428) may electrically connect to the ionizer 114 (FIG. 3), the shunt and aperture 116 (FIG. 3), and the detector 122 (FIG. 3).

The PCB base plate 302 may also include signal processing electronics for processing signals received from the detector 122 (FIG. 3). For example, in the embodiment as illustrated, the PCB base plate 302 includes a digital signal processor (DSP) 430. The digital signal processor 430 may be coupled to the detector 122 via conductive traces 424 and 428, for example. The scope of the invention includes any combination or number of signal processing components, and other embodiments may include other conventional signal processing devices.

The FIG. 4 embodiments of the magnetic sector 120, the electrostatic energy analyzer 118, and the PCB base plate 302 illustrate different types of electrical contacts/connectors, fasteners, and connections between the PCB base plate 302 and the magnetic sector 120 and electrostatic energy analyzer 118. These embodiments are illustrative, and should not be construed to restrict the types, numbers, or combinations of contacts/connectors or fasteners, or the manner in which the magnetic sector 120 or electrostatic energy analyzer 118 is coupled to the PCB base plate 302.

The PCB base plate 302 may be formed of any conventional base material (i.e., substrate material) known to one of skill in the art. For example, the PCB base plate 302 may be formed of an appropriately etched DBC (i.e., a die or dual bonded copper substrate or the like), or a FR-4 base material or other similar flame-retardant material. If out-gassing of the PCB base plate 302 is a concern or consideration in the design of the system 300, then the PCB base plate 302 may be formed of a Teflon or ceramic base material, for example. The choice of a PCB base plate substrate material ultimately depends upon balancing the cost of out-gassing in operation of the system 300 with the cost of using a PCB base plate formed of a substrate with low out-gassing properties.

Figure 5:
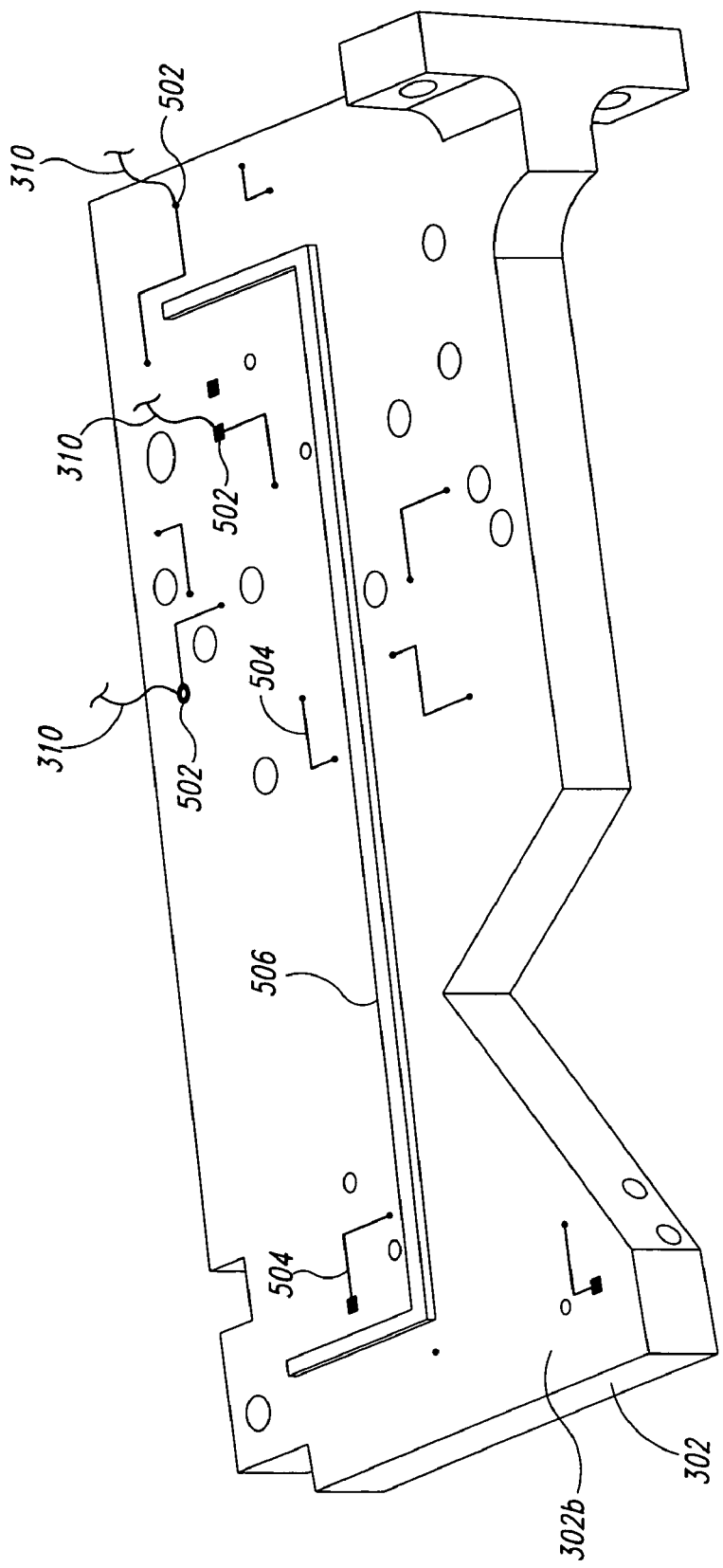
FIG. 5 is an isometric view of the back side of the PCB base plate of the mass spectrometer system of FIG. 3, according to an embodiment of the invention.

FIG. 5 is an isometric view of the backside 302b of the PCB base plate 302 of FIG. 3, according to an embodiment of the invention. As illustrated, the backside 302b includes electrical conductorss 502 for connecting the conducting leads 310 of the electrical cable 210 (FIG. 3). As appreciated by one of skill in the art, the electrical conductors 502 may include any type of connecting conductor, including but not limited to, pads, bumps, pinholes, and conducting vias. The electrical conductors 502 may be connected to each other by conducting traces 504, thus enabling power, control, and I/O to be sent to the elements 114-122 of the ion optic assembly 201 mounted on the front side 302a of the PCB base plate 302 and signal processing electronics (not shown) mounted on the front side 302a and/or backside 302b of the PCB base plate 302.

In another embodiment, the backside 302b of the PCB base plate 302 includes a metallic or non-metallic bracket/bar 506 to reinforce the PCB base plate 302, thereby providing additional structural support and restricting out-of-plane motion of the PCB base plate 302 when the system 300 is operating. In the spirit of the present invention, the bracket/bar 506 may be of any shape or size to provide more structural integrity to the PCB base plate 302.

Figure 6:
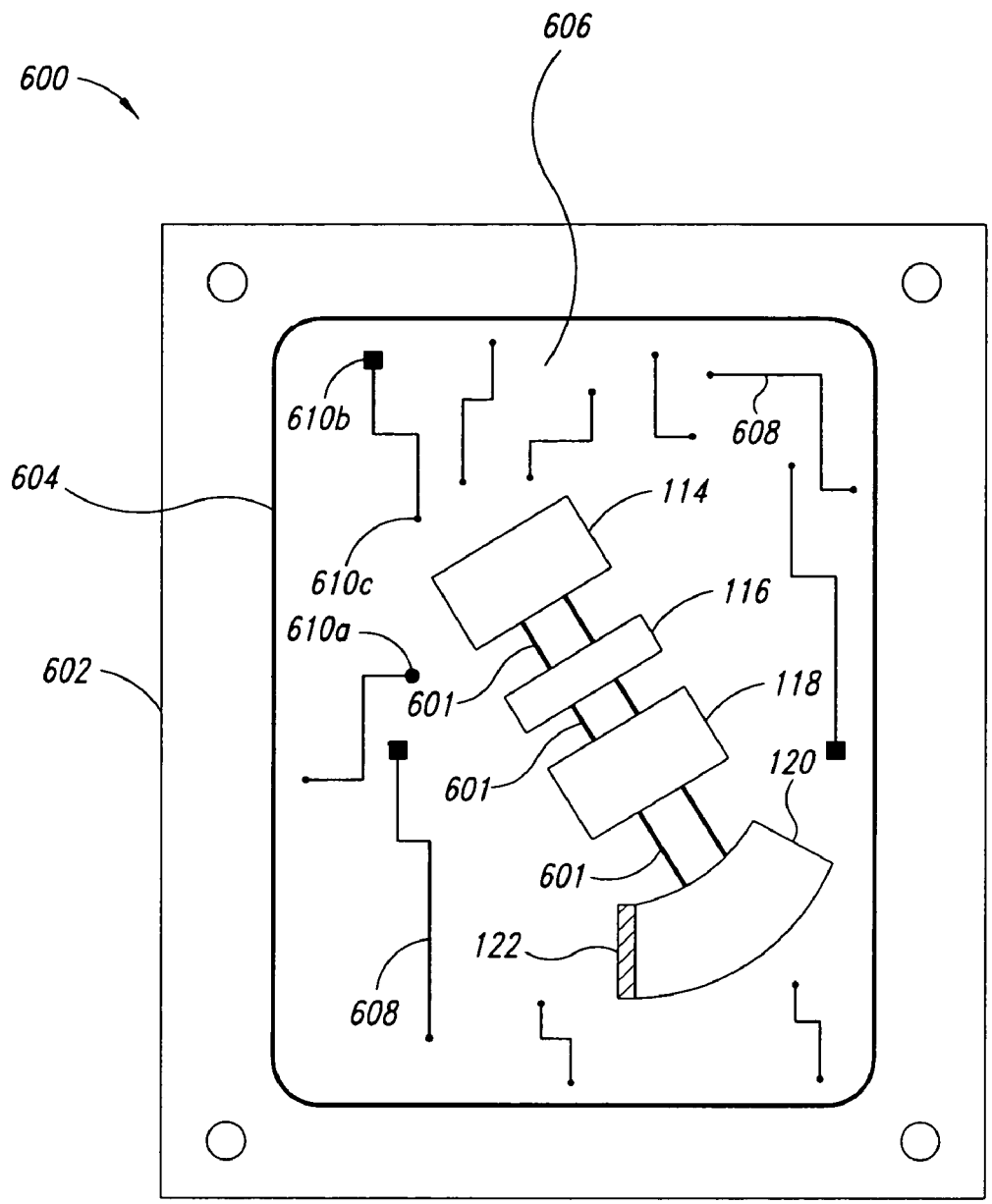
FIG. 6 is a plan view of a mass spectrometer system, according to an embodiment of the invention.

FIG. 6 is a plan view of a mass spectrometer system 600, according to an embodiment of the invention. In the embodiment as illustrated, the system 600 includes the ionizer 114, the shunt and aperture 116, the electrostatic energy analyzer 118, the magnetic section 120, and the detector 122 (i.e., elements of the ion optic assembly 201 of FIG. 3). The ion optic elements 114-122 are coupled to a PCB base plate 602 to form an ion beam path 601. Furthermore, in the embodiment as illustrated, the PCB base plate 602 is a vacuum flange of the MS system 600. The PCB base plate 602 includes a sealant portion 604 and an electrical portion 606. A vacuum housing (not shown) is mounted to the sealant portion 604, thereby enclosing the electrical portion 606. A pump (not shown) is coupled to either the vacuum housing or the PCB base plate 602 to create a vacuum in the enclosed electrical portion 606 of the system 600. In one embodiment, the vacuum housing includes an O-ring (not shown) for coupling to the sealant portion 604. The sealant portion 604 may be a rim or other such structure for mating with the O-ring to create a seal under vacuum. In another embodiment, the sealant portion 604 includes an O-ring for mating with a groove or equivalent structure on the vacuum housing for creating a seal when the electrical portion 606 is under vacuum.

The electrical portion 606 includes conducting traces 608 and electrical contacts/connectors (i.e., electrical conductors) for connecting with the ion optic elements 114-122. The electrical contacts/connectors include conducting vias 610a, and metallic contacts such as metallic pads 610b and bumps 610c, although the scope of the invention covers all types of contacts/connectors known to one of skill in the art. In the embodiment of the invention as illustrated, the PCB base plate 602 provides an optical platform to secure the ion optic elements 114-122 in a fixed and precise positional relationship with one another.

Furthermore, the PCB base plate 602 routes power received from an external power source (not shown) to the ion optic elements 114-122, and may electrically couple the ion optic elements 114-122 to each other. Furthermore, the PCB base plate 602 may route control signals from an external controller (not shown) to one or more of the ion optic elements 114-122. The PCB base plate 602 may include signal processing electronics for processing signals received from the detector 122, and may route I/O from the detector 122 to an external I/O device (not shown).

In the embodiment as illustrated, the PCB base plate 602 is configured to reduce the number and/or length of conducting leads that supply power, control and I/O to the ion optic elements 114-122 and/or signal processing electronics mounted to the PCB base plate 602, provide a stable optical platform for mounting the ion optic elements 114-122, and provide a vacuum seal for operation of the system 600.

All of the above U.S. patents, U.S. patent application publications, U.S. patent applications, foreign patents, foreign patent applications and non-patent publications referred to in this specification and/or listed in the Application Data Sheet, including but not limited to U.S. Provisional Patent Application No. 60/484,801; U.S. Provisional Patent Application No. 60/497,799; U.S. Provisional Patent Application No. 60/506,521; U.S. Provisional Patent Application No. 60/557,920; U.S. Provisional Patent Application No. 60/557,969; U.S. Provisional Patent Application No. 60/550,663; U.S. Provisional Patent Application No. 60/550,664; U.S. Provisional Patent Application No. 60/557,968; U.S. Provisional Patent Application No. 60/601,810; U.S. Provisional Patent Application No. 60/601,867; U.S. Provisional Patent Application No. 60/601,803; U.S. Non-Provisional patent application Ser. No. 10/811,576; U.S. Non-Provisional patent application Ser. No. 10/860,776; U.S. Non-Provisional patent application Ser. No. 11/071,992; U.S. Non-Provisional patent application Ser. No. 11/073,426; U.S. Non-Provisional patent application Ser. No. 11/097,465; U.S. Pat. No. 5,317,151; U.S. Pat. No. 5,801,380; U.S. Pat. No. 6,046,451; U.S. Pat. No. 6,182,831; U.S. Pat. No. 6,191,419; U.S. Pat. No. 6,403,956; U.S. Pat. No. 6,576,899; U.S. Pat. No. 6,847,036; and PCT Application Ser. No. PCT/US03/05517, are incorporated herein by reference, in their entirety.

In addition, the published materials by J. Mattauch, *Ergebnisse der exakten Naturwissenschaften*, vol. 19, pp. 170-236, 1940; "Fundamentals of Focal Plane Detector cs" K. Birkinshaw, *Jrnl. of Mass Spectrometry*, Vol. 32,795-806 (1997); A. A. Scheidemann, R. B. Darling, F. J. Schumacher, and A. Isakarov, *Tech. Digest of the 14th Int Forum on Process Analytical Chem.* (IFPAC-2000), Lake Las Vegas, Nev., Jan. 23-26, 2000, abstract 1-067"; "R. B. Darling, A. A. Scheidemann, K. N. Bhat, and T.-C. Chen., *Proc. of the 14th IEEE Int. Conf. on Micro Electro Mechanical Systems* (MEMS-2001), Interlaken, Switzerland, Jan. 21-25, 2001, pp. 90-93; Nier, D. J. Schlutter, *Rev. Sci. Instrum.* 56(2), pp. 214-219, 1985; and T. W. Burgoyne et. al., *J. Am. Soc. Mass Spectrum* 8, pp. 307-318, 1997, are incorporated by reference in their entirety.

From the foregoing it will be appreciated that, although specific embodiments of the invention have been described herein for purposes of illustration, various modifications may be made without deviating from the spirit and scope of the invention. Accordingly, the invention is not limited except as by the appended claims.

The invention claimed is:

1. A mass spectrometer system, comprising:
   a vacuum flange;
   a first ion optic element;
   a second ion optic element; and
   a printed circuit board optical bench (PCB optical bench) coupled to the vacuum flange; the PCB optical bench having a first set of mounting holes to mount the first ion optic element in a first position and orientation and a second set of mounting holes to mount the second ion optic element in a second position and orientation, wherein the first ion optic element is mounted to the PCB optical bench via the first set of mounting holes and the second ion optic element is mounted to the PCB optical bench via the second set of mounting holes to have a defined spacing and orientation with respect to the first ion optic element such that the first and the second ion optic elements form at least a portion of an ion optic assembly with an ion beam optical path extending from the first ion optic element to the second ion optic element.

2. The system of claim 1, further comprising:
   a vacuum housing positioned to enclose a volume on a first side of the PCB optical bench on which the first and the second ion optic elements are mounted, the vacuum housing coupled to a sealant portion of the vacuum flange to sustain a vacuum.

3. The system of claim 2 wherein the sealant portion comprises an O-ring.

4. The system of claim 1, further comprising:
an electrical cable coupled to the PCB optical bench.

5. The system of claim 4 wherein the electrical cable supplies power to the ion optic assembly.

6. The system of claim 4, further comprising:
a detector, wherein the electrical cable is communicatively coupled to the detector via the PCB optical bench as an input/output signal path.

7. The system of claim 1, further comprising:
signal-processing electronics operable to process signals received from the ion optic assembly.

8. The system of claim 1 wherein the first ion optic element comprises an ionizer, an electrostatic energy analyzer, a magnetic section, and a detector and the second optic element comprises the other of the ionizer, the electrostatic energy analyzer, the magnetic section, or the detector of the ion optic assembly.

9. The system of claim 8, further comprising: signal-processing electronics carried by the PCB optical bench and operable to process signals received from the detector.

10. The system of claim 1 wherein the PCB optical bench is formed of multiple layers.

11. The system of claim 1 wherein the PCB optical bench comprises a substrate formed of FR-4 material.

12. A mass spectrometer system, comprising:
an ion optic assembly including a first ion optic element and at least a second ion optic element;
a printed circuit board optical bench (PCB optical bench) having a first set of mounting holes to mount the first ion optic element in a first position and orientation and at least a second set of mounting holes to mount the second ion optic element in a second position and orientation such that the first and the second ion optic elements, when mounted to the respective first set of mounting holes and the second set of mounting holes, form at least a portion of the ion optic assembly with an ion beam optical path extending from the first ion optic element to the second ion optic element, the PCB optical bench including
a sealant portion, and
an electrical portion, wherein at least a part of the ion optic assembly is electrically coupled to the electrical portion.

13. The system of claim 12 wherein the first ion optic element is one of an ionizer, an electrostatic energy analyzer, a magnetic section, and a detector.

14. The system of claim 13 wherein the first ion optic element is one of a shunt and an aperture.

15. The system of claim 12, further comprising:
a vacuum housing positioned to enclose the electrical portion and the ion optic assembly, the vacuum housing coupled to the sealant portion of the PCB optical bench to sustain a vacuum.

16. The system of claim 15 wherein the sealant portion is a rim.

17. The system of claim 12 wherein the electrical portion of the PCB optical bench comprises signal-processing electronics to process signals received from the ion optic assembly.

18. The system of claim 12 wherein the PCB optical bench is formed of multiple layers.

19. The system of claim 12 wherein the PCB optical bench comprises a substrate formed of FR-4 material.

20. An analytical system, comprising:
an optical bench in the form of a printed circuit board having
a first set of mounting holes to mount a first ion optic element;
a second set of mounting holes to mount a second ion optic element, the second set of mounting holes located with respect to the first set of mounting holes such that the first ion optic element and the second ion optic element form an uninterrupted first portion of an ion beam path when mounted to respective first set and second set of mounting holes on the optical bench;
at least a first conductive trace carried by the optical bench and electrically coupleable to the first ion optic element when mounted via the first set of mounting holes to supply power to the first ion optic element; and
at least a second conductive trace carried by the optical bench and electrically coupleable to the second ion optic element when mounted via the second set of mounting holes to supply power to the second ion optic element.

21. The analytical system of claim 20, further comprising:
a sealant portion to mount a vacuum housing.

22. The analytical system of claim 21 wherein the sealant portion comprises a rim configured to receive the vacuum housing.

23. The analytical system of claim 21 wherein the sealant portion comprises an O-ring to mount with the vacuum housing.

24. The analytical system of claim 20 wherein the first ion optic element is one of
a shunt and an aperture mounted to the optical bench via the first set of mounting holes; and
wherein the second ion optic element is one of a an electrostatic energy analyzer as the second ion optic element mounted to the optical bench via the second set of mounting holes.

25. The analytical system of claim 20 wherein the first ion optic element is
an electrostatic energy analyzer mounted to the optical bench via the first set of mounting holes; and
wherein the second ion optic element is a magnetic sector mounted to the optical bench via the second set of mounting holes.

26. The analytical system of claim 20, wherein the optical bench further has:
a third set of mounting holes to mount a magnetic sector, the third set of mounting holes located with respect to the second set of mounting holes to form an uninterrupted second portion of the ion beam path; and further comprising
a detector mounted to the magnetic sector;
signal processing electronics; and
at least a third conductive trace carried by the optical bench and electrically coupleable to the signal processing electronics and the detector when the magnetic sector is mounted via the third set of mounting holes.

* * * * *